US012765394B2

(12) United States Patent
Liu et al.

(10) Patent No.: US 12,765,394 B2
(45) Date of Patent: Oct. 13, 2026

(54) SEMICONDUCTOR PACKAGES AND RELATED METHODS

(71) Applicant: SEMICONDUCTOR COMPONENTS INDUSTRIES, LLC, Scottsdale, AZ (US)

(72) Inventors: Yong Liu, Cumberland Foreside, ME (US); Yusheng Lin, Phoenix, AZ (US); Liangbiao Chen, Scarborough, ME (US)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 263 days.

(21) Appl. No.: 18/760,515

(22) Filed: Jul. 1, 2024

(65) Prior Publication Data

US 2024/0355638 A1 Oct. 24, 2024

Related U.S. Application Data

(62) Division of application No. 17/304,792, filed on Jun. 25, 2021, now Pat. No. 12,062,549, which is a (Continued)

(51) Int. Cl.
*H10W 70/04* (2026.01)
*H10W 70/40* (2026.01)
(Continued)

(52) U.S. Cl.
CPC ......... *H10W 70/04* (2026.01); *H10W 70/451* (2026.01); *H10W 70/457* (2026.01);
(Continued)

(58) Field of Classification Search
CPC . H10W 70/04; H10W 70/451; H10W 70/457; H10W 70/479; H10W 70/60;
(Continued)

(56) References Cited

U.S. PATENT DOCUMENTS 6,377,461 B1 4/2002 Ozmat et al.
7,019,395 B2 3/2006 Hirano et al.
(Continued)

FOREIGN PATENT DOCUMENTS

CN 101276806 A 10/2008
EP 0582084 A2 9/1994

OTHER PUBLICATIONS

Double Side Cooled Module FF400R07A01E3_S6, published online by Infineon as least as early as Jul. 28, 2017, available online at https://www.infineon.com/dgdl/Infineon-FF400R07A01E3_S6-DS-v03_03-EN.pdf?fileId=5546d46262b31d2e016301931a14339a, last visited Sep. 19, 2019.

(Continued)

*Primary Examiner* — Thanhha S Pham
(74) *Attorney, Agent, or Firm* — IPTechLaw

(57) ABSTRACT

Methods of forming semiconductor packages include providing a first insulator layer coupled with a first metallic layer. A recess is formed in the first metallic layer and a semiconductor die is mechanically coupled therein. The die is mechanically coupled with a second metallic layer and the second metallic layer is coupled with a second insulator layer. The die and layers are at least partially encapsulated to form the semiconductor package. The first and/or second metallic layers may be insulator-metal substrates, metal-insulator-metal (MIM) substrates, or may be formed of lead frames. In implementations the package does not include a spacer between the die and the first metallic layer and does not include a spacer between the die and the second metallic layer. In implementations the first insulator layer and the second insulator layer are exposed through the encapsulant or are mechanically coupled with metallic layers exposed through the encapsulant.

20 Claims, 8 Drawing Sheets

Related U.S. Application Data division of application No. 16/674,279, filed on Nov. 5, 2019, now Pat. No. 11,075,090.

(51) Int. Cl.

| | |
|---|---|
| ***H10W 70/60*** | (2026.01) |
| ***H10W 70/685*** | (2026.01) |
| ***H10W 74/00*** | (2026.01) |
| ***H10W 74/01*** | (2026.01) |
| ***H10W 90/00*** | (2026.01) |

(52) U.S. Cl.

CPC ......... *H10W 70/479* (2026.01); *H10W 70/60* (2026.01); *H10W 70/685* (2026.01); *H10W 74/00* (2026.01); *H10W 74/01* (2026.01); *H10W 90/811* (2026.01)

(58) Field of Classification Search

CPC ... H10W 70/685; H10W 74/00; H10W 74/01; H10W 90/811; H10W 70/611; H10W 90/401; H10W 40/778; H10W 70/468; H10W 70/481; H10W 40/255; H10W 76/138; H10W 95/00; H10W 72/00; H10W 72/20; H10W 74/129

See application file for complete search history.

(56) References Cited

U.S. PATENT DOCUMENTS

| | | | | |
|---|---|---|---|---|
| 7,851,930 | B1 | 12/2010 | Gupta | |
| 11,715,677 | B2 | 8/2023 | Talledo et al. | |
| 2020/0194356 | A1 * | 6/2020 | Lee ..................... | H10W 70/424 |
| 2020/0402894 | A1 | 12/2020 | Luo et al. | |

OTHER PUBLICATIONS

Infineon FF400R07A01E3 Double Side Cooled IGBT Module, published online by SystemPlus at least as early as Jan. 23, 2018, available online at https://www.systemplus.fr/reverse-costing-reports/infineon-ff400r07a01e3-double-side-cooled-igbt-module/, last visited Sep. 19, 2019.

AHPM15-CAG Mechanical Case Outline, Published by ON Semiconductor at least as early as Apr. 12, 2018, available online at https://www.onsemi.com/pub/Collateral/100DD.PDF, last visited Sep. 19, 2019.

* cited by examiner

SEMICONDUCTOR PACKAGES AND RELATED METHODS

CROSS REFERENCE TO RELATED APPLICATIONS

This application is a divisional application of the earlier U.S. Utility Patent Application to Liu entitled "Semiconductor Packages and Related Methods," application Ser. No. 17/304,792, filed Jun. 25, 2021, now pending, which is a divisional application of the earlier U.S. Utility Patent Application to Liu entitled "Semiconductor Packages and Related Methods," application Ser. No. 16/674,279, filed Nov. 5, 2019, now U.S. Pat. No. 11,075,090 issued Jul. 27, 2021, the disclosures of each of which are hereby incorporated entirely herein by reference.

BACKGROUND

1. Technical Field

Aspects of this document relate generally to semiconductor packages. More specific implementations involve substrates used in the formation of semiconductor packages.

2. Background

Semiconductor packages may be used to electrically interconnect electrical contacts of the die with electrical leads which electrically couple the semiconductor package with a printed circuit board (PCB). Various semiconductor packages may be attached to heat sinks to draw heat away from the semiconductor die.

SUMMARY

Implementations of methods of forming semiconductor packages may include: providing a first insulator layer coupled with a first metallic layer; forming a recess in the first metallic layer; mechanically coupling a semiconductor die at least partially within the recess, a perimeter of the semiconductor die located entirely within a perimeter of the recess; mechanically coupling the semiconductor die with a second metallic layer, the second metallic layer coupled with a second insulator layer; and at least partially encapsulating the first insulator layer, the first metallic layer, the semiconductor die, the second insulator layer, and the second metallic layer in an encapsulant to form a semiconductor package.

Implementations of methods of forming semiconductor packages may include one, all, or any of the following:

The semiconductor package may not include a spacer between the semiconductor die and the first metallic layer, and the semiconductor package may not include a spacer between the semiconductor die and the second metallic layer.

A lead frame may form the first metallic layer.

A lead frame may form the second metallic layer.

The first insulator layer and the second insulator layer may be exposed through the encapsulant.

Implementations of methods of forming semiconductor packages may include: providing a first metal-insulator-metal (MIM) substrate having a first metallic layer and a second metallic layer coupled on opposite sides of a first insulator layer; forming a recess in the first metallic layer; mechanically coupling a semiconductor die at least partially within the recess, a perimeter of the semiconductor die located entirely within a perimeter of the recess; mechanically coupling the semiconductor die with a third metallic layer of a second MIM substrate, the second MIM substrate including the third metallic layer and a fourth metallic layer on opposite sides of a second insulator layer; and at least partially encapsulating the first MIM substrate, the semiconductor die, and the second MIM substrate in an encapsulant to form a semiconductor package.

Implementations of forming semiconductor packages may include one, all, or any of the following:

The semiconductor package may not include a spacer between the semiconductor die and the first metallic layer, and the semiconductor package may not include a spacer between the semiconductor die and the third metallic layer.

The first metallic layer may include two metallic sections electrically isolated from one another prior to coupling the semiconductor die with the first metallic layer.

The second metallic layer and/or the fourth metallic layer may include a slot configured to reduce warpage of the semiconductor package.

Implementations of semiconductor packages may include: a first insulator layer coupled with at least a first metallic layer, the first metallic layer comprising a recess therein; a semiconductor die mechanically coupled at least partially within the recess, a perimeter of the semiconductor die located entirely within a perimeter of the recess; at least a second metallic layer coupled with a second insulator layer, the second metallic layer mechanically coupled with the semiconductor die; and an encapsulant at least partially encapsulating the first insulator layer, the first metallic layer, the semiconductor die, the second insulator layer, and the second metallic layer.

Implementations of semiconductor packages may include one, all, or any of the following:

The semiconductor die may be mechanically coupled within the recess using one of a soldered metal and/or a sintered metal, and the semiconductor die may be mechanically coupled with the second metallic layer using a soldered metal and/or a sintered metal.

The semiconductor package may not include a spacer between the semiconductor die and the first metallic layer, and the semiconductor package may not include a spacer between the semiconductor die and the second metallic layer.

A lead frame may form the first metallic layer.

The lead frame may be mechanically attached to the first insulator layer using a silicone elastomer.

A lead frame may form the second metallic layer.

The first insulator layer and the second insulator layer may be exposed through the encapsulant.

The first insulator layer and the first metallic layer may be components of a first metal-insulator-metal substrate, the first MIM substrate including the first metallic layer and a third metallic layer coupled on opposite sides of the first insulator layer.

The second insulator layer and the second metallic layer may be components of a second metal-insulator-metal substrate, the second MIM substrate including the second metallic layer and a fourth metallic layer coupled on opposite sides of the second insulator layer.

The first metallic layer may include two metallic sections electrically isolated from one another prior to coupling the semiconductor die with the first metallic layer.

The second metallic layer and/or the fourth metallic layer may include a slot configured to reduce warpage of the semiconductor package.

The foregoing and other aspects, features, and advantages will be apparent to those artisans of ordinary skill in the art from the DESCRIPTION and DRAWINGS, and from the CLAIMS.

BRIEF DESCRIPTION OF THE DRAWINGS

Implementations will hereinafter be described in conjunction with the appended drawings, where like designations denote like elements, and.

DESCRIPTION

This disclosure, its aspects and implementations, are not limited to the specific components, assembly procedures or method elements disclosed herein. Many additional components, assembly procedures and/or method elements known in the art consistent with the intended semiconductor packages and related methods will become apparent for use with particular implementations from this disclosure. Accordingly, for example, although particular implementations are disclosed, such implementations and implementing components may comprise any shape, size, style, type, model, version, measurement, concentration, material, quantity, method element, step, and/or the like as is known in the art for such structures and methods of semiconductor packages and related methods, and implementing components and methods, consistent with the intended operation and methods.

Figure 1:
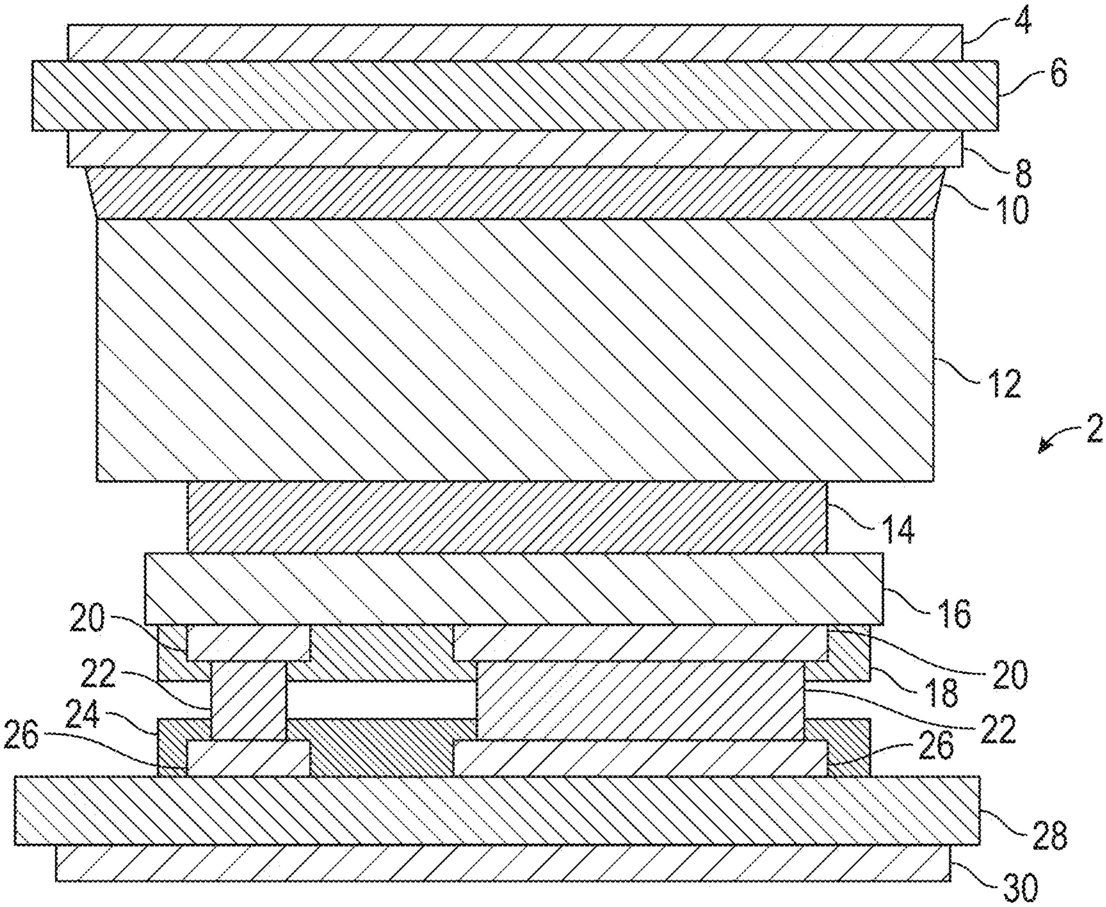
FIG. 1 is a cross-section view of an implementation of a semiconductor assembly.

Referring now to FIG. 1, in which element sizes and thicknesses are not necessarily drawn to scale (as with the other drawings), an implementation of a semiconductor assembly (assembly) 2 is shown. In FIG. 1 the assembly 2 is shown without an encapsulant to focus on the other elements of the assembly, but the assembly may be encapsulated to form a semiconductor package. The assembly 2 includes a topmost metallic layer (layer) 4 which in the implementation shown is a 200 μm (or about 200 μm) layer of copper. Layer 4 is coupled with an insulator layer (layer) 6 which in the implementation shown is a 320 μm (or about 320 μm) layer of Al2O3. Layer 6 is coupled with a metallic layer (layer) 8 which in the implementation shown is a 400 μm (or about 400 μm) layer of copper. In the implementation shown layers 4, 6 and 8 are all included in a first direct bonded copper (DBC) substrate.

The first DBC substrate is coupled with a first solder layer (layer) 10 which in the implementation is a 200 μm (or about 200 μm) layer of solder. In some implementations, the solder may be an SAC305 lead-free solder or other conductive attach material. Layer 10 is coupled with a spacer 12 which in the implementation shown is a 1.93 mm (or about 1.93 mm) layer of conductive material such as $CuMo_{70}$ or Cu. The spacer is coupled with a second solder layer (layer) 14 which in the implementation shown is a 200 μm (or about 200 μm) layer of a $PbSn_8Ag_2$ solder or other conductive attach materials. Layer 14 is coupled with a semiconductor die (die) 16 which in the implementation shown is an insulated-gate bipolar transistor (IGBT) or MOSFET. The IGBT or MOSFET has one or more polyimide (PI) layers (layers) 18 which have portions selectively removed to apply a solder top metal/solderable top metal (STM) 20 and then a third solder or a conductive material layer (layer) 22 (which in the implementation illustrated includes two separate solder areas) is used to couple the IGBT with a second substrate. In the implementation shown layer 22 is a 200 μm (or about 200 μm) layer of an $SnSb_5$ solder or other solder, or other conductive materials.

The second substrate includes a metallic layer (layer) 26, which in the implementation shown is a 400 μm (or about 400 μm) layer of copper or other metal (and includes two or more separate portions forming the layer). Layer 26 is coupled with an insulator layer (layer) 28, which in the implementation shown is a 320 μm (or about 320 μm) layer of $Al_2O_3$ or other ceramic material. Layer 28 is coupled with layer (layer) 30, which in the implementation shown is a 200 μm (or about 200 μm) layer of copper or other metal. Layers 26, 28 and 30 in the implementation shown form a second DBC substrate. A photo-imageable solder resist (PSR) layer (layer) 24 is coupled with the second DBC substrate and portions of it are selectively removed before layer 26 is mechanically coupled with the IGBT or MOSFET using the solder layer 22. The IGBT may, in addition to being mechanically coupled, also be electrically coupled through layer 26 and/or through the spacer to layer 8 to electrically couple with leads of the package.

As used herein, the term "layer" includes layers which are formed of multiple portions which are located in a similar plane, formed of a similar material, and have similar heights.

Figure 3:
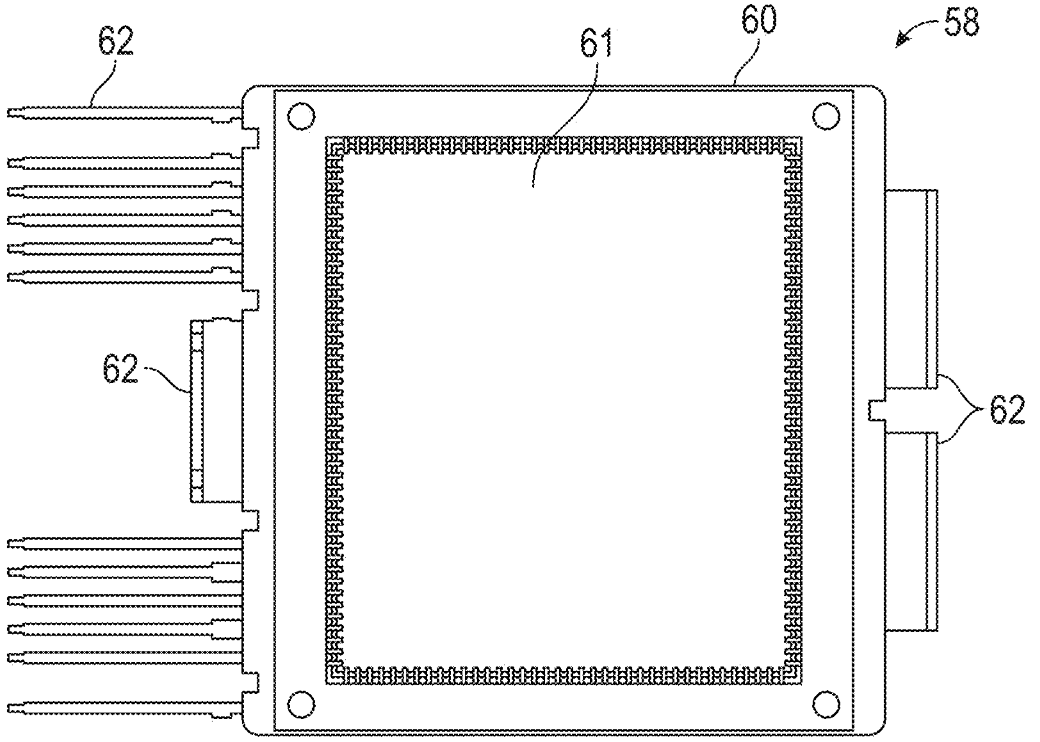
FIG. 3 is a top view of an implementation of a semiconductor package including the semiconductor assembly of FIG. 1.
Figure 4:
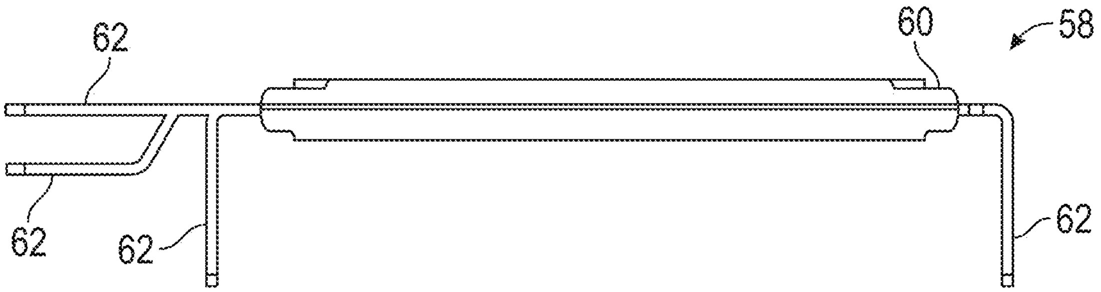
FIG. 4 is a side view of the semiconductor package of FIG. 3.

The semiconductor assembly 2, as illustrated, includes three solder layers and a spacer and, when formed into a package by encapsulation and/or singulation, such as the semiconductor package 58 of FIGS. 3-4, has a package size of (or about) 55.0 mm by 55.0 mm by 4.7 mm (this package size, as with other package sizes disclosed herein, includes the size of the encapsulated portions but does not include the leads extending from the encapsulant). FIG. 3 illustrates that a metallic layer (layer) 61 (such as layers 4 and/or 30) is/are exposed through an encapsulant 60 (such as on the top and bottom) and that leads 62 extend from the encapsulant to electrically couple electrical contacts of the die with power and other components such as for transferring signals to/from the die and controlling a connected power source/receiving power from a connected power source. FIG. 4 illustrates the leads formed in various configurations to couple with external elements as desired.

Metals other than copper may be used for the copper layers, and in such implementations the DBC substrates may instead be metal-insulator-metal (MIM) substrates. Aluminum is only one example used for the exemplary purposes of this disclosure. Similarly, other insulative materials could be used for the insulator layers and other metals could be used for the solder layers and the spacer. In the implementation shown the two DBC substrates act as heat sinks to draw heat away from the die and the package formed from the assembly is a dual-side cooling automotive high-power module (AHPM), though the layers and methods discussed could be used to form other types of semiconductor packages.

In some implementations the spacer could be less wide than the die. In such implementations, however, die cracks and/or chipping may occur near the spacer mount area during processing. In other implementations the spacer could be wider than the die (as in FIG. 1). This eliminates some die cracking near the spacer, but this size mismatch may lead to solder "voids" between the spacer and die at the die corners and may induce die corner cracks. Such solder "voids" are representatively illustrated in FIG. 1 where, between spacer 12 and die 16 there is some area above of the die where the solder is absent. The die corner cracks in implementations are caused by a coefficient of thermal expansion (CTE) mismatch between the spacer, solder, and the molded underfill (MUF) epoxy or epoxy molding compound (EMC). While the package is cooling after encapsulation, the spacer shrinks faster than the MUF or EMC and the MUF or EMC resists the motion of the die (induced by spacer shrinking) at the die corners due to the corner solder voids which causes the die corner cracks.

Figure 2:
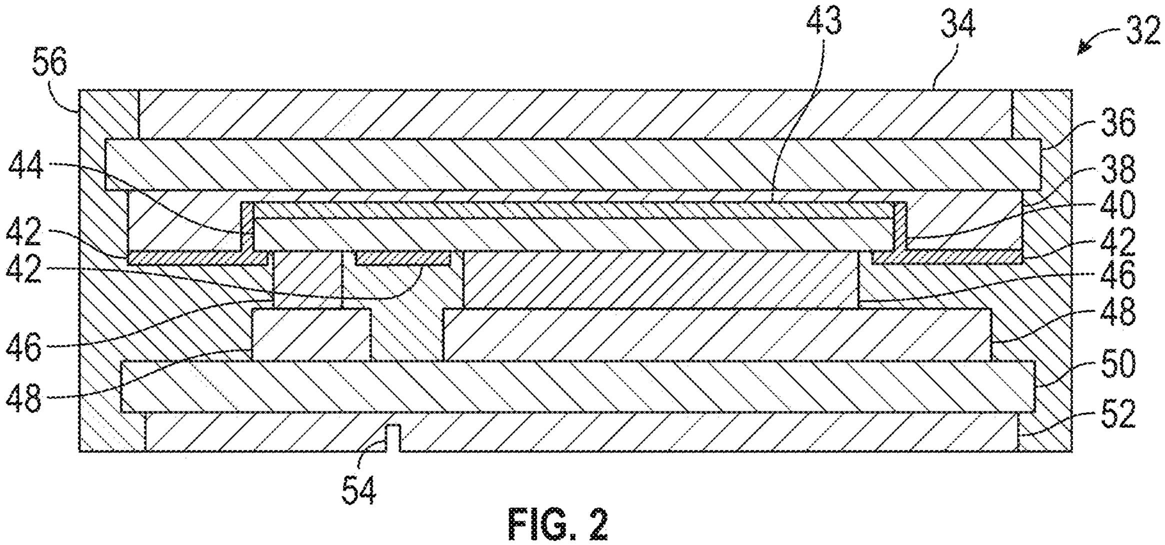
FIG. 2 is a cross-section view of an implementation of a semiconductor package.

Referring now to FIG. 2, another implementation of a semiconductor package is illustrated. The semiconductor package (package) 2 includes a first MIM substrate formed from metallic layer (layer) 34, insulator layer (layer) 36, and metallic layer (layer) 38. A second MIM substrate is formed from metallic layer (layer) 48, insulator layer (layer) 50, and metallic layer (layer) 52. In the implementation shown the MIM substrates are DBC substrates using copper layers coupled with $Al_2O_3$ insulator layers, though materials other than copper could be used for the metallic layers and insulator materials other than $Al_2O_3$ could be used for the insulator layers. The metallic layers could in implementations be aluminum, copper, or stainless steel, as examples. The insulator layers could in various implementations be, by non-limiting example, $Al_2O_3$, Zr-doped $Al_2O_3$, AlN, BeO, an epoxy-based layer, and other ceramic, composite, or organic insulator materials. One or more of the MIM substrates could be an insulated metal substrate (IMS) including an aluminum layer, an insulator layer, and a copper layer.

Metallic layer (layer) 38 is has a recess 40 formed therein. This recess could be formed by any material removal technique, by non-limiting example, could include etching, milling, laser ablation, casting, forming, drilling, and any other material removal or formation process. A semiconductor die (die) 44 is mechanically coupled within the recess using a metallic layer 43, which in the implementation illustrated is formed of a high melting temperature solder such as, by non-limiting example, $PbSn_8Ag_2$, or using Ag sintering to form a soldered or sintered layer. Metals other than Ag could be used for the sintered layer, such as gold as a non-limiting example, and/or solders other than $PbSn_8Ag_2$ could be used for the soldered layer. The sintered layer may be formed using a dry powder or paste which is heated to form the sintered layer. In the implementation illustrated, die 44 is a metal-oxide-semiconductor field-effect transistor (MOSFET) die or an IGBT die, though in other implementations it could be any another type of semiconductor die.

After the die is coupled within the recess a photoresist layer 42 is deposited, which is seen in the implementation to seep into areas between the die and the sidewalls of the recess and also to cover the bottom of the metallic layer 38 and die 44. The photoresist layer may be, by non-limiting example, a polyimide (PI) photoresist or a photo-mask solder resist (PSR) and may be imaged and selectively removed to expose electrical contacts of the die. After the electrical contacts are exposed a metallic layer (layer) 46 is used to mechanically couple the die with layer 48. The photoresist helps to prevent overflow of layer 46 to undesired areas. The die may be electrically coupled with leads (not shown) of the package through layer 38 and/or layer 48 (such as by leads later being electrically coupled with layer 38 and/or 48).

The metallic layer 46 may be formed of a solder with a lower melting temperature than metallic layer 43 so that metallic layer 43 does not reflow while layer 46 is being reflowed. By non-limiting example, layer 46 could be an $SnSb_5$ solder while layer 43 is a $PbSn_8Ag_2$ solder. Alternatively, layer 46 could be formed of a high melting temperature solder if layer 43 is formed by Ag sintering, or layer 46 and layer 43 could both be formed using Ag sintering.

An encapsulant 56 is applied using various encapsulating techniques such as, by non-limiting example, molding, transfer molding, cavity molding, or injection molding to at least partially encapsulate the die and layers to form the package 32. Metallic layers 34 and 52 are exposed through the encapsulant which helps to draw heat away from the die. In the implementation illustrated in FIG. 2 there are only two solder or sintered layers, and that there is no spacer between the die and either of the MIM substrates. As used herein, the term "spacer" excludes soldered layers, sintered layers, solder bumps, solderable top metal (STM) layers, under bump metal (UBM) layers, substrates or any portion thereof, and semiconductor die or any portion thereof.

As illustrated, in various implementations, a slot 54 may be included in layer 52 to reduce, control and/or balance warpage of the package. This slot may be formed using any material removal technique. The package 32 in implementations has a size of (or of about) 55.0 mm by 55.0 mm by 2.3-2.6 mm. Accordingly, it may have a similar top profile as package 58 of FIG. 3, but may have a thinner side profile than that shown in FIG. 4 since the thickness has been reduced from 4.7 mm to about 2.3-2.6 mm. In the implementation illustrated the package 32 is an ultra-thin dual-side cooling (DSC) automotive high power module (AHPM) with one or more embedded die on DBC or MIM substrates. In other implementations the package could be a non-AHPM package.

Figure 5:
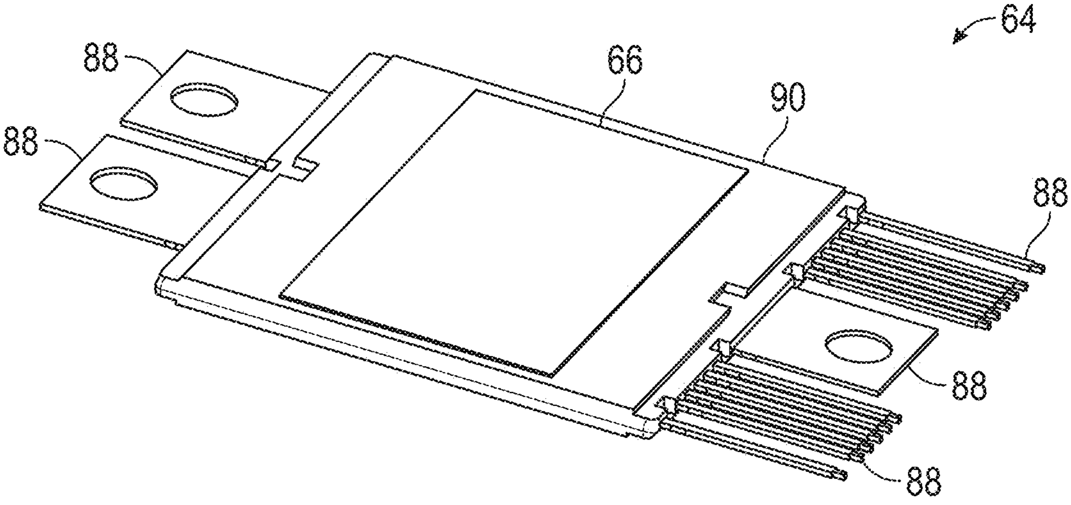
FIG. 5 is a top perspective view of another implementation of a semiconductor package.
Figure 8:
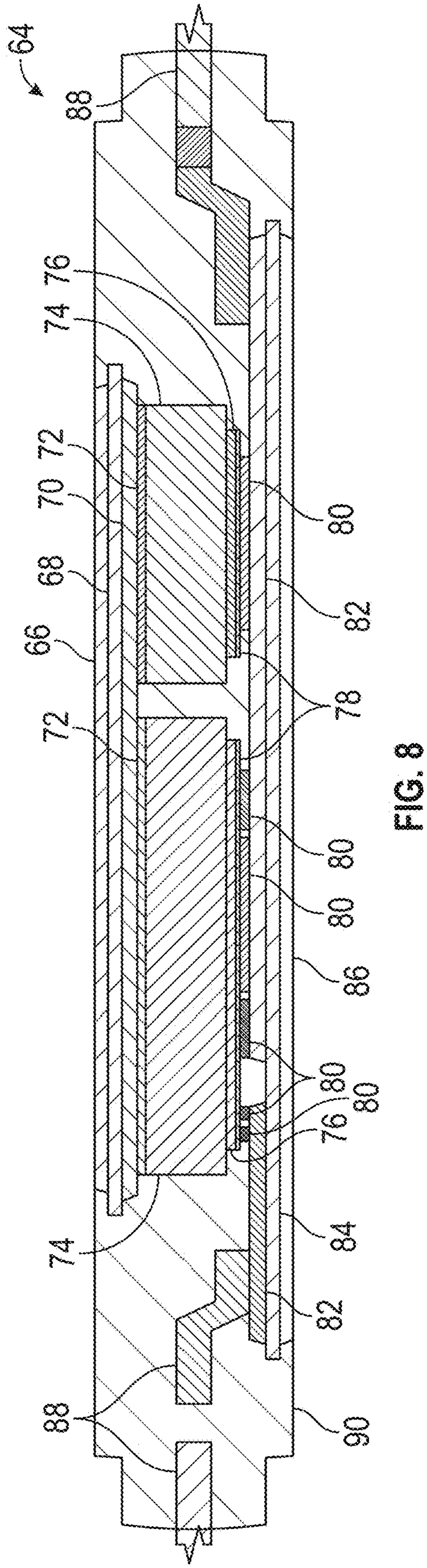
FIG. 8 is a cross-section view of the semiconductor package of FIG. 5.

Referring now to FIGS. 5 and 8, another implementation of a semiconductor package is shown. In FIG. 5 the semiconductor package (package) 64 it is illustrated to include an encapsulant 90 through which a metallic layer (layer) 66 is exposed (and a similar metallic layer may be exposed through the bottom of the package), while leads 88 extend from the encapsulant to couple the internal die with other components.

Referring to FIG. 8, the package 64 is illustrated to include a first MIM substrate including a metallic layer (layer) 66, an insulator layer (layer) 68, and a metallic layer (layer) 70. A second MIM substrate is also illustrated including a metallic layer (layer) 82, an insulator layer (layer) 84, and a metallic layer (layer) 86. In the implementations illustrated the two MIM substrates are DBC substrates, though they could be any other substrate types as described herein for other packages. Solder layer (layer) 72 is used to couple the topmost MIM substrate with spacers 74, which may have the same characteristics as other spacers described herein, and solder layer (layer) 76 is used to mechanically couple the spacers with semiconductor die (die) 78, which in the implementation shown are IGBTs, though in other implementations they may be other die types. Solder layers 80 (which in this flip chip design are solder bumps deposited first onto the die/chip) are used to mechanically couple the die with the bottommost MIM substrate. Although photoresist may be used at different stages, such as a PI or PSR photoresist, they are not shown in the drawings to facilitate viewing of the other elements. The leads 88 and encapsulant 90 are shown. From FIG. 8 it is illustrated that metallic layers 66 and 86 are both exposed through the encapsulant. Package 64 is an AHPM package, but in other implementations package 64 could be configured to be another package type. The die may be electrically coupled with leads through layer 70 and/or layer 82, in implementations.

Figure 6:
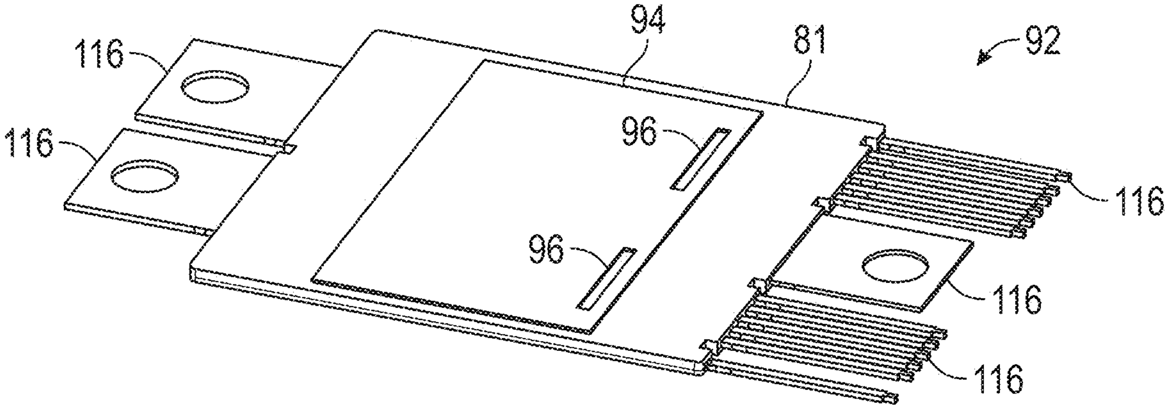
FIG. 6 is a top perspective view of another implementation of a semiconductor package.
Figure 7:
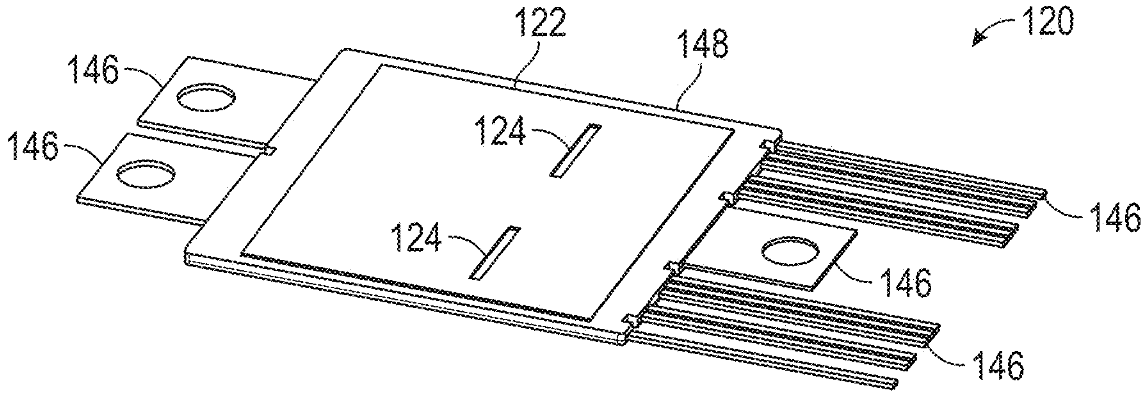
FIG. 7 is a top perspective view of another implementation of a semiconductor package.
Figure 9:
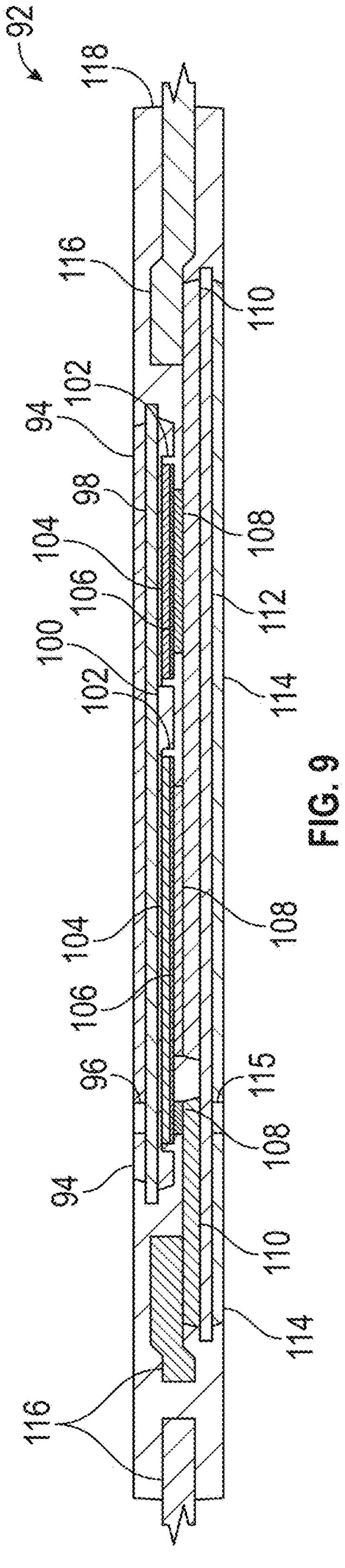
FIG. 9 is a cross-section view of the semiconductor package of FIG. 6.
Figure 10:
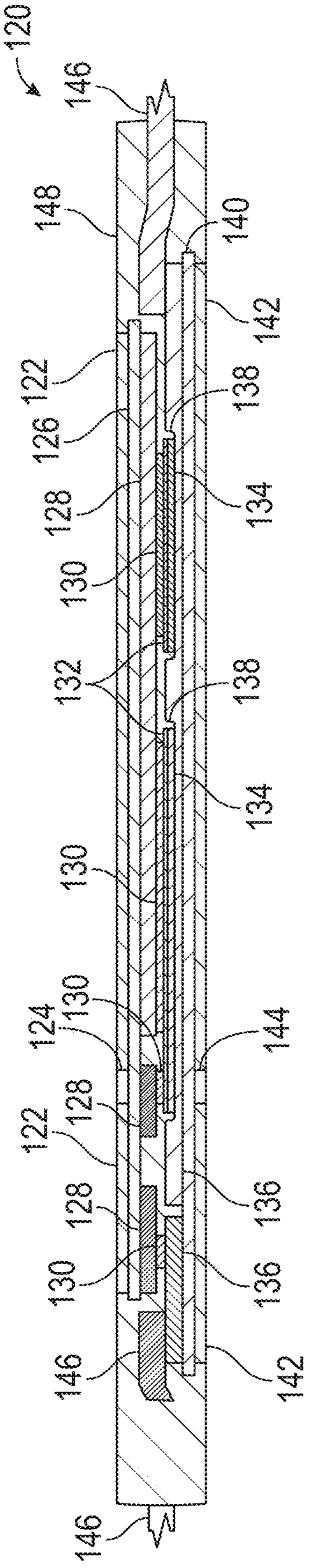
FIG. 10 is a cross-section view of the semiconductor package of FIG. 7.
Figure 11:
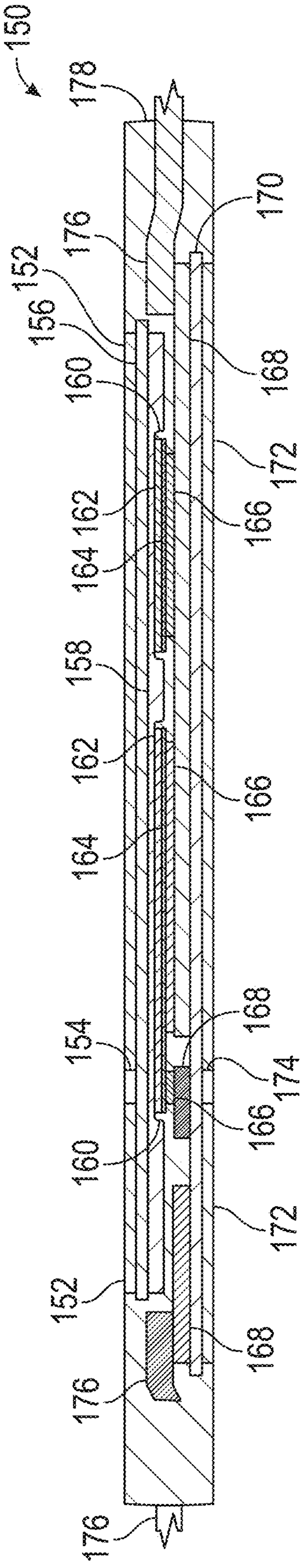
FIG. 11 is a cross-section view of another implementation of a semiconductor package.

Referring now to FIGS. 6, 7, and 9-11, other implementations of semiconductor packages are illustrated. FIGS. 6-7 show that semiconductor packages (packages) 92 and 120 are thinner than package 64, though having a relatively similar footprint. FIG. 9 shows that package 92 is thinner than package 64, and packages 120 and 150 of FIGS. 10-11 are similarly thinner than package 64.

Referring to the implementations illustrated in FIGS. 6 and 9, semiconductor package (package) 92 includes a first MIM substrate and a second MIM substrate and is formed using a flip-chip method. The first MIM substrate includes a metallic layer (layer) 94 (having a slot 96 to reduce warping, as previously discussed), an insulator layer (layer) 98, and a metallic layer (layer) 100 having a recess 102 therein. The second MIM substrate includes a metallic layer (layer) 114 (having a slot 115 to reduce warping, as previously discussed), an insulator layer (layer) 112, and a metallic layer (layer) 110. The MIM substrates in the implementation illustrated are DBC substrates each having two copper layers on opposite sides of an $Al_2O_3$ layer, but they could be formed of other insulators and metals as discussed herein with respect to other packages.

A metallic layer (layer) 104, which may be a high melting temperature solder or Ag sintering as previously discussed, is used to couple the semiconductor die (die) 106 within the recess, and a metallic layer (layer) 108 (which in this flip chip design includes solder bumps deposited first onto the die/chip), which may be a lower melting temperature solder (or Ag sintering or a high melting temperature solder if layer 106 was Ag sintering) is used to mechanically couple the die (including electrical leads of the die) with layer 110. This may, for example, include reflowing solidified solder bumps once the die is appropriately positioned. The die may be electrically coupled with the leads 116 through layer 110 and/or layer 100, in implementations (such as by leads later being electrically coupled with layers 110 and/or 100).

The die in the implementation shown is a MOSFET die, and the package is an AHPM package, but in other implementations another type of die and/or package may be formed using the same techniques. Photoresist such as PI or PSR may be used in conjunction with the metallic layers 104 and/or 108 but they are not shown to facilitate easy viewing of the other elements. Leads 116 in the implementation shown are electrically coupled with the die through layer 110, and an encapsulant 118 is used to at least partially encapsulate the die and layers. It is seen in FIG. 9 that layers 94 and 114 are both exposed through the encapsulant. The slots 96 and 115 may not extend the full length of the package but may be intermittent as representatively as illustrated in the implementation of FIG. 6.

Package 92 is similar in many regards to package 64 except, it includes fewer solder (or other metallic reflowed/sintered) layers, includes no spacers, and has a thinner profile. Package 64 has a package size of (or of about) 55.0 mm by 55.0 mm by 4.7 mm and is formed using a flip chip method. Package 92, also formed using a flip chip method, has a package size of (or of about) 55.0 mm by 55.0 mm by 2.30 mm. Package 92 is accordingly an ultra-thin DSC AHPM with embedded die on DBC/MIM substrates.

Referring to FIGS. 7 and 10, semiconductor package (package) 120 includes a first MIM substrate and a second MIM substrate and is formed using a chip up design. The first MIM substrate includes a metallic layer (layer) 122 (having a slot 124 to reduce warping, as previously discussed), an insulator layer (layer) 126, and a metallic layer (layer) 128. The second MIM substrate includes a metallic layer (layer) 142 (having a slot 144 to reduce warping, as previously discussed), an insulator layer (layer) 140, and a metallic layer (layer) 136 having a recess 138 therein. The MIM substrates in the implementation illustrated are DBC substrates each having two copper layers on opposite sides of an Al2O3 layer, but they could be formed of other insulators and metals as discussed herein with respect to other packages.

A metallic layer (layer) 134, which may be a high melting temperature solder or Ag sintering as previously discussed, is used to couple the semiconductor die (die) 132 within the recess, and a metallic layer (layer) 130, which may be a lower melting temperature solder (or Ag sintering or a high melting temperature solder if layer 134 was Ag sintering) is used to mechanically couple the die with layer 128. The die may be electrically coupled with the leads 146 through layer 136 and/or layer 128, in implementations (such as by leads later being electrically coupled with layer 136 and/or 128).

The die in the implementation shown is a MOSFET die or IGBT die, and the package is an AHPM package, but in other implementations another type of die and/or package may be formed using the same techniques. Photoresist such as PI or PSR may be used in conjunction with the metallic layers 130 and/or 134 but they are not included in the drawing to facilitate easy viewing of the other elements. Leads 146 in the shown implementation are electrically coupled with the die through layer 136, and an encapsulant 148 is used to at least partially encapsulate the die and layers. As illustrated in FIG. 10, layers 122 and 142 are both exposed through the encapsulant. The slots 124 and 144 may not extend the full length of the package but may be intermittent as representatively illustrated in FIG. 7.

Package 120 is similar in many regards to package 64 except it includes fewer solder (or other metallic reflowed/sintered) layers, includes no spacers, and has a thinner profile. Package 120 has a package size of (or of about) 55.0 mm by 55.0 mm by 2.30 mm. Package 120 is accordingly an ultra-thin DSC AHPM with embedded die on DBC/MIM substrates.

Referring to FIG. 11, semiconductor package (package) 150, which from a perspective view similar to FIG. 7 may appear identical to package 120, includes a first MIM substrate and a second MIM substrate and is formed using a chip down design. The first MIM substrate includes a metallic layer (layer) 152 (having a slot 154 to reduce warping, as previously discussed), an insulator layer (layer) 156, and a metallic layer (layer) 158 having a recess 160 therein. The second MIM substrate includes a metallic layer (layer) 172 (having a slot 174 to reduce warping, as previously discussed), an insulator layer (layer) 170, and a metallic layer (layer) 168. The MIM substrates in the implementation shown are DBC substrates each having two copper layers on opposite sides of an $Al_2O_3$ layer, but the substrates could be any other substrate type disclosed in this document.

A metallic layer (layer) 162, which may be a high melting temperature solder or Ag sintering as previously discussed, is used to couple the semiconductor die (die) 164 within the recess. Metallic layer (layer) 166, which may be a lower temperature solder (or Ag sintering or a high melting temperature solder if layer 162 was Ag sintering), is used to mechanically couple the die with layer 168. The die may be electrically coupled with the leads 176 through layer 158 and/or layer 168, in implementations (such as by leads later being electrically coupled with layer 158 and/or 168).

The die in the implementation shown is a MOSFET or an IGBT die, and the package is an AHPM package, but in other implementations another type of die and/or package may be formed using the same techniques. Photoresist such as PI or PSR may be used in conjunction with the metallic layers 162 and/or 166 but they are not shown to facilitate easy viewing of the other elements. Leads 176 in the shown implementation are electrically coupled with the die through layer 168, and an encapsulant 178 is used to at least partially encapsulate the die and layers. It is illustrated in FIG. 11 that layers 152 and 172 are both exposed through the encapsulant. The slots 154 and 174 may not extend the full length of the package but may be intermittent as representatively illustrated with respect to the packages of FIGS. 6-7.

Package 150 is similar in many regards to package 64 except it includes fewer solder (or other metallic reflowed/sintered) layers, includes no spacers, and has a thinner profile. Package 150 has a package size of (or of about) 55.0 mm by 55.0 mm by 2.30 mm. Package 150 is accordingly an ultra-thin DSC AHPM with embedded die on DBC/MIM substrates.

Finite element analysis (FEA) was used to model signal pad solder joint plastic peeling strain and die top stress for packages 64 and 92 (the two flip chip designs) and it was found that the solder peeling plastic strain for package 92 was less than 0.5 times that of package 64. Die top stress for package 92 was less than 0.8 times that of package 64.

Figure 12:
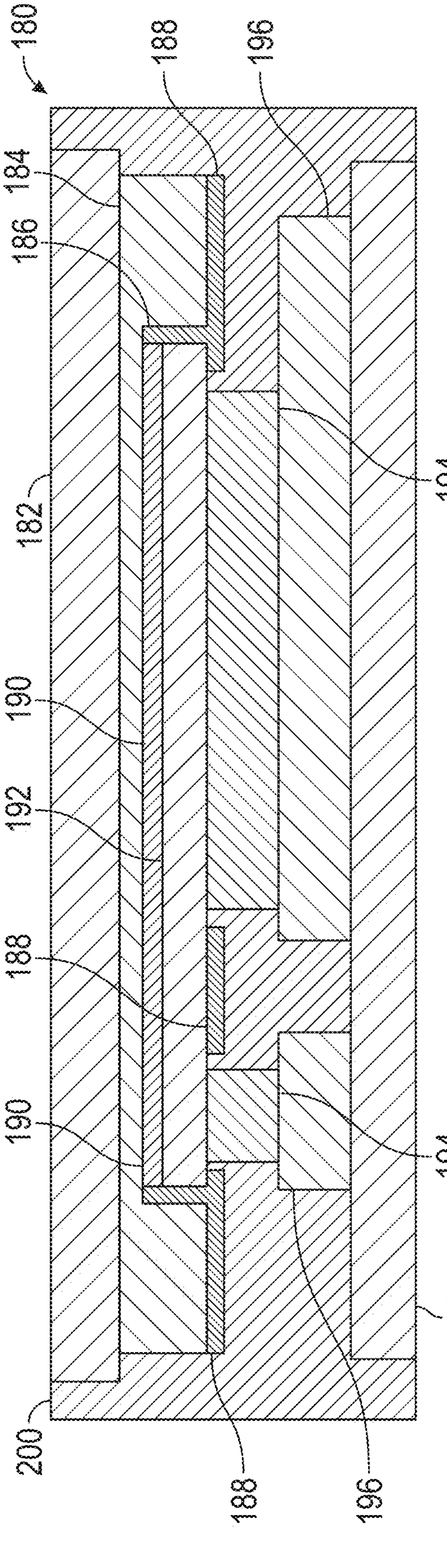
FIG. 12 is a cross-section view of another implementation of a semiconductor package.

Referring now to FIG. 12, another implementation of a semiconductor package is illustrated. Semiconductor package (package) 180 includes a first insulator-metal substrate and a second insulator-metal substrate. The first insulator-metal substrate is formed of an insulator layer (layer) 182 coupled with a metallic layer (layer) 184 having a recess 186 formed therein. The second insulator-metal substrate is formed of an insulator layer (layer) 198 coupled with a metallic layer (layer) 196. The MIM substrates in the implementation shown are single-bonded copper (SBC) substrates each having a copper layer coupled with an $Al_2O_3$ layer, but they could be formed of other insulators and metals as discussed herein with respect to other packages.

A metallic layer (layer) 190, which may be a high melting temperature solder or Ag sintering as previously discussed, is used to couple the semiconductor die (die) 192 within the recess. Photoresist 188 such as PI or PSR is deposited and selectively removed to expose electrical contacts of the die. After the electrical contacts are exposed, metallic layer (layer) 194, which may be a lower temperature solder (or Ag sintering or a high temperature solder if layer 190 was Ag sintering) is used to mechanically couple the electrical contacts of the die with layer 196. The die may be electrically coupled with leads (not shown) of the package through layer 184 and/or layer 196, in implementations (such as by leads later being electrically coupled with layer 184 and/or 196). Encapsulant 200 is used to at least partially encapsulate the die and layers.

The die in the implementation shown is a MOSFET or an IGBT die, and the package is an AHPM package, but in other implementations another type of die and/or package may be formed using the same techniques. As illustrated in FIG. 12, in various implementations, the insulator layers 182 and 198 are both exposed through the encapsulant. In implementations the insulator layers could be formed of a highly thermally conductive ceramic material, such as, by non-limiting example, $Al_2O_3$, AlN, $Si_3N_4$, or other thermally conductive materials to assist in drawing heat away from the die.

Package 180 has dimensions of (or of about) 55.0 mm by 55.0 mm by 1.7-2.0 mm, which gives it a similar footprint to package 58 except with a thinner side profile. It also has only two sintered or reflowed metallic layers and no spacer. Package 180 has no exposed metallic layer on an outside of the package, which may help to reduce warpage (such as during the die attach process of coupling the die within the recess) and may help reduce the likelihood of peeling or breaking either of the sintered or reflowed metallic layers (one or both of which may be signal carriers). An alternative of the design of package 180 could use one or more lead frames instead of one or more of the insulator-metal substrates. Package 180 is an ultra-thin DSC AHPM SBC (with embedded die) on SBC. In other implementations, as this package is already relatively thin, the layer 184 may exclude the recess and the die may simply be coupled to a non-recess surface of layer 184.

Figure 13:
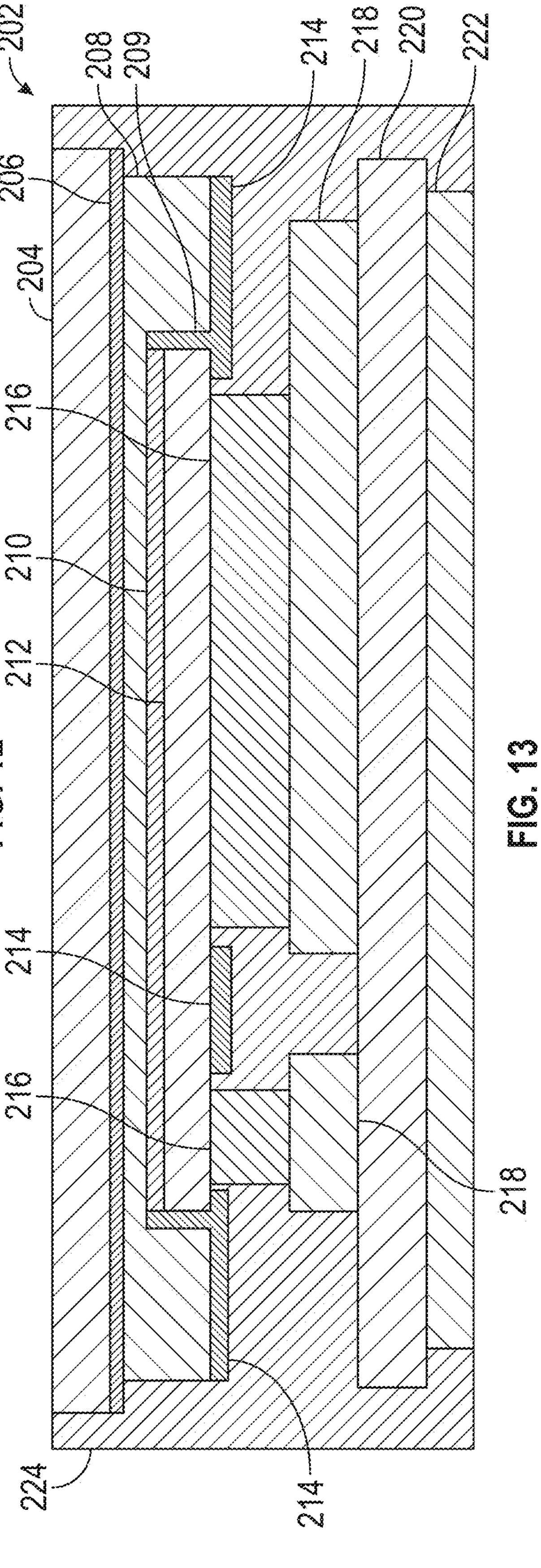
FIG. 13 is a cross-section view of another implementation of a semiconductor package.

Referring now to FIG. 13, another implementation of a semiconductor package is illustrated. Semiconductor package (package) 202 includes a lead frame coupled with an insulator layer and an MIM substrate. The lead frame 208 is mechanically coupled with an insulator layer (layer) 204 using a highly thermally conductive adhesive layer (layer) 206, which may be, by non-limiting example, an epoxy, glue, urethane, silicone elastomer, and any other adhesive type. In the implementation illustrated, layer 206 is a silicone elastomer. The lead frame has a recess 209 formed therein. The MIM substrate is formed of a metallic layer (layer) 218 coupled with an insulator layer (layer) 220 which is in turn coupled with a metallic layer (layer) 222. The MIM substrate in the implementation shown is a DBC substrate having two copper layers coupled with an $Al_2O_3$ layer, but it could be formed of other insulators and metals as discussed herein with respect to other packages.

A metallic layer (layer) 210, which may be a high melting temperature solder or Ag sintering as previously discussed, is used to couple the semiconductor die (die) 212 within the recess. Photoresist 214 such as PI or PSR is deposited and selectively removed to expose electrical contacts of the die. After the electrical contacts are exposed, metallic layer (layer) 216, which may be a lower melting temperature solder (or Ag sintering or a high temperature solder if layer 210 was Ag sintering) is used to mechanically couple the electrical contacts of the die with metallic layer 218. The die may be electrically coupled with leads (not shown) of the package through the lead frame and/or layer 218, in implementations (such as by leads later being electrically coupled with the lead frame and/or layer 218). Encapsulant 224 is used to at least partially encapsulate the die, layers and lead frame.

The die in the implementation shown is a MOSFET die or an IGBT die, and the package is an AHPM package, but in other implementations another type of die and/or package may be formed using the same techniques. As illustrated in FIG. 13, the insulator layer 204 and metallic layer 222 are both exposed through the encapsulant. In implementations the insulator layer could be formed of a highly thermally conductive ceramic material, as discussed with other packages herein, to assist in drawing heat away from the die.

Package 202 has dimensions of (or of about) 55.0 mm by 55.0 mm by 2.6-3.2 mm, which gives it a similar footprint to package 58 except with a thinner side profile. It also has only two sintered or reflowed metallic layers and no spacer. Package 202 has only one exposed metallic layer on an outside of the package, which may help to reduce warpage (such as during the die attach process of coupling the die within the recess) and may help reduce the likelihood of peeling or breaking either of the sintered or reflowed metallic layers (one or both of which may be signal carriers). Package 202 is an ultra-thin DSC AHPM with die on a lead frame/insulator coupled with a DBC substrate. In other implementations the lead frame may exclude the recess and the die may simply be coupled to a non-recess surface of the lead frame. The lead frame may be formed originally with the recess therein or the recess may later be formed therein using any material removal process disclosed herein.

Figure 14:
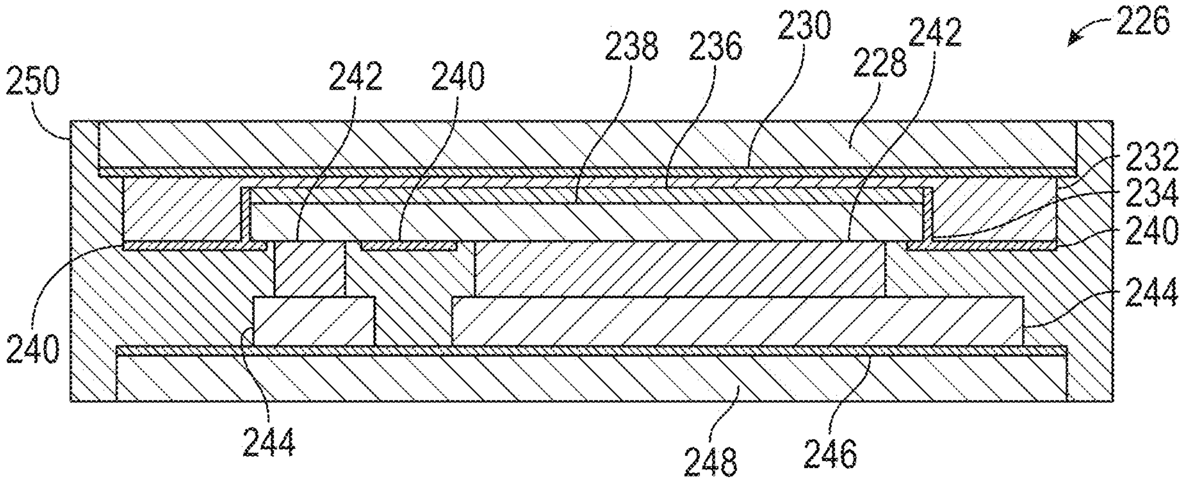
FIG. 14 is a cross-section view of another implementation of a semiconductor package.

Referring now to FIG. 14, another implementation of a semiconductor package is illustrated. Semiconductor package (package) 226 includes a first lead frame coupled with an insulator layer and a second lead frame coupled with an insulator layer. The first lead frame 232 is mechanically coupled with an insulator layer (layer) 228 using a highly thermally conductive adhesive layer (layer) 230, which may be, by non-limiting example an epoxy, glue, urethane, silicone elastomer, and other various adhesive materials. In the implementation shown layer 230 is a silicone elastomer. The lead frame has a recess 234 formed therein. The second lead frame 244 is mechanically coupled with an insulator layer (layer) 248 using a highly thermally conductive adhesive layer (layer) 246 which may be of the same or different material as layer 230. In the implementation illustrated layer 246 is a silicone elastomer.

A metallic layer (layer) 236, which may be a high melting temperature solder or Ag sintering as previously discussed, is used to couple the semiconductor die (die) 238 within the recess. Photoresist 240 such as PI or PSR is deposited and selectively removed to expose electrical contacts of the die. After the electrical contacts are exposed, metallic layer (layer) 242, which may be a lower melting temperature solder (or Ag sintering or a high temperature solder if layer 236 was Ag sintering) is used to mechanically couple the electrical contacts of the die with the second lead frame 244. The die may be electrically coupled with leads (not shown) of the package through the first and/or second lead frame, in implementations (such as by leads later being electrically coupled with the first and/or second lead frame). Encapsulant 250 is used to at least partially encapsulate the die and layers.

The die in the implementation shown is a MOSFET die or an IGBT die, and the package is an AHPM package, but in other implementations another type of die and/or package may be formed using the same techniques. As illustrated in FIG. 14 the insulator layers 228 and 248 are both exposed through the encapsulant. In implementations the insulator layers could be formed of a highly thermally conductive ceramic material, as discussed herein with respect to other packages, to assist in drawing heat away from the die.

Package 226 has dimensions of (or of about) 55.0 mm by 55.0 mm by 2.6-3.2 mm, which gives it a similar footprint to package 58 except with a thinner side profile. It also has only two sintered or reflowed metallic layers and no spacer. Package 226 has no exposed metallic layers on an outside of the package, which may help to reduce warpage (such as during the die attach process of coupling the die within the recess) and may help reduce the likelihood of peeling or breaking either of the sintered or reflowed metallic layers (one or both of which may be signal carriers). Package 226 is an ultra-thin DSC AHPM with die on a lead frame/insulator coupled with a lead frame/insulator. In other implementations the first lead frame may exclude the recess and the die may simply be coupled to a non-recess surface of the first lead frame. The first lead frame may be formed originally with the recess therein or the recess may later be formed therein using any material removal technique.

Any of the methods and packages herein that illustrate only a single die coupled within a recess may be scaled to include multiple die coupled within multiple recesses or multiple die coupled within a common recess. The lead frames of any of the packages discussed herein may be formed of any metals including, by non-limiting example, copper, a copper alloy, steel, and any other electrically conductive material. Encapsulant materials may be formed, by non-limiting example, of a polymer resin/epoxy, a heat-cured resin/epoxy, and so forth.

Figure 15:
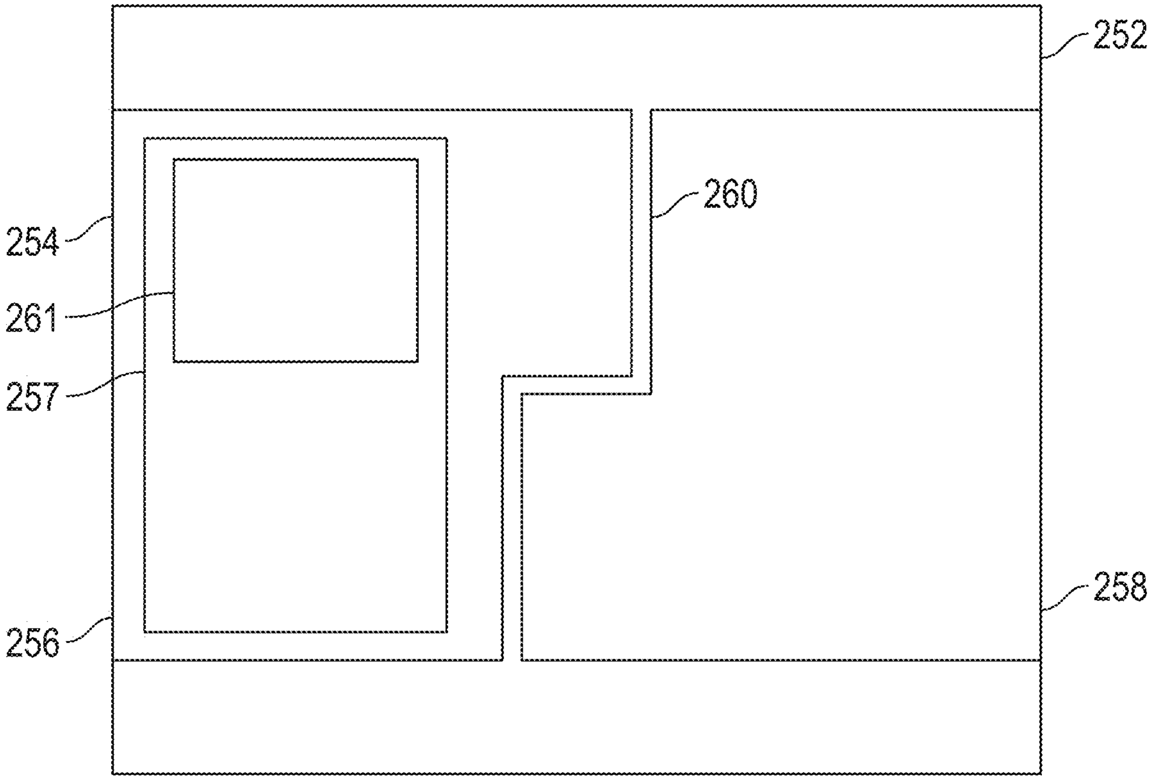
FIG. 15 is a top view of an implementation of a substrate configuration used to form a semiconductor package.

Referring now to FIG. 15, an implementation of a MIM structure is illustrated. Only the metallic layers of the MIM structure are illustrated, for ease of viewing them, but an insulator layer would be included between the two. In the structure of FIG. 15 a first metallic layer (layer) 252 is formed of a single contiguous piece of metal. The second metallic layer (layer) 254, however, is formed of a first portion 256 and a second portion 258, these two portions being originally electrically isolated from one another by a split 260 between them. They could later be electrically coupled during the formation of a package, if desired. In the first portion 256 a recess 257 is shown, and a semiconductor die (die) 261 is illustrated coupled therein. It is seen, from this top view, that the outer perimeter of the die is fully within the outer perimeter of the recess, and this is also the case with all other packages disclosed herein that situate the die within a recess.

The second portion 258 is not illustrated with a recess, but it may have a recess also, and a die therein in various implementations and the recess of each portion may additionally include other elements/die and/or additional recesses may be included for additional elements/die. In the implementation illustrated the MIM substrate is a DBC substrate using copper layers coupled with an insulator layer (not shown), but in other implementations other metallic layer materials and/or insulator layer materials may be used, as discussed with respect to other packages herein. In some implementations the splitting up of the second metallic layer into separate portions may facilitate, for example, embedding a high side (HS) die within a recess of one portion and a low side (LS) die within a recess of the other portion. This concept could also be applied to an insulator-metal substrate that only includes one metal layer, where the single metal layer is split into multiple portions.

Figure 16:
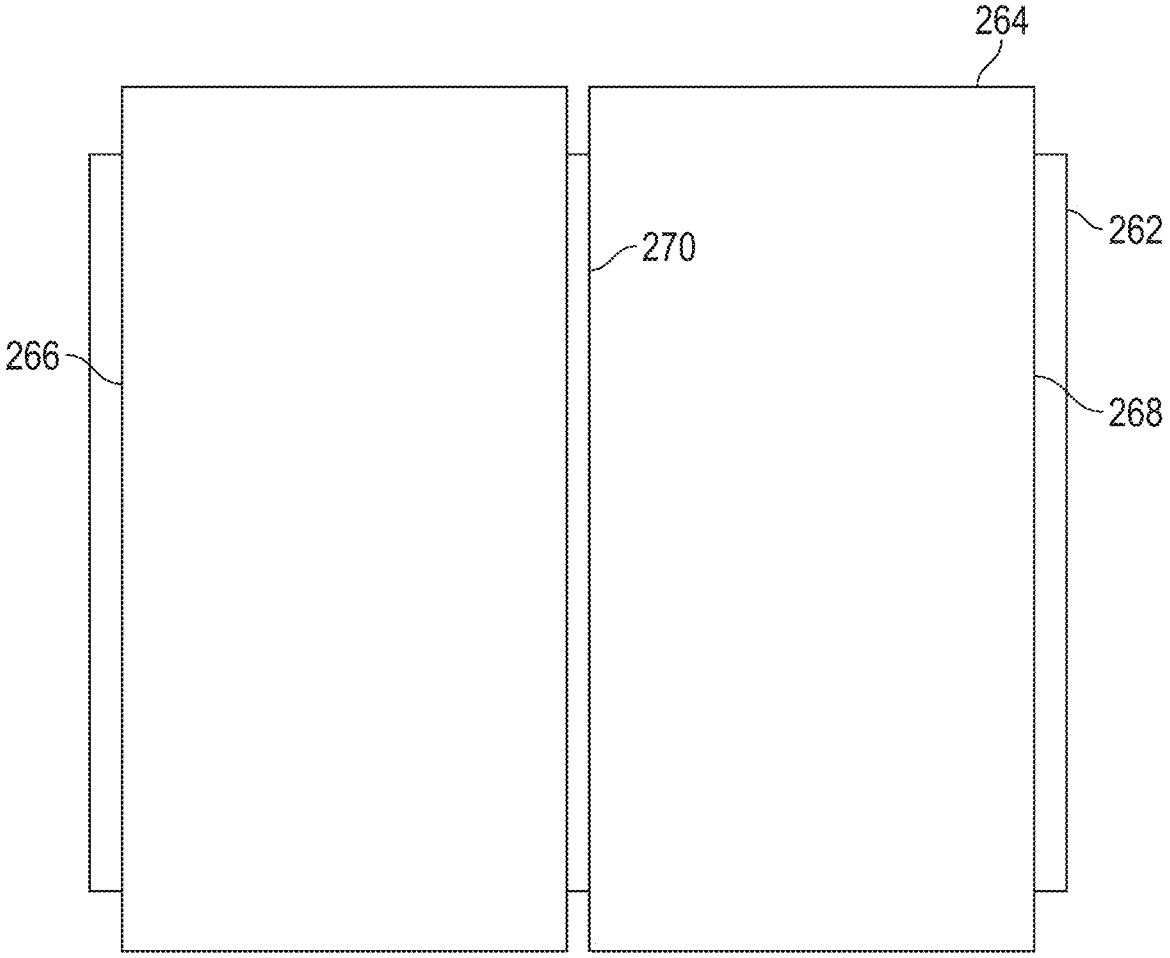
FIG. 16 is a top view of another implementation of a substrate configuration used to form a semiconductor package.

FIG. 16 illustrates a similar MIM structure, again with the first metallic layer (layer) 262 and second metallic layer (layer) 264 illustrated but with the insulator layer not shown. The second metallic layer includes a first portion 266 and a second portion 268, and in this case the split 270 is a straight vertical split. The split may accordingly be designed as desired to accommodate different components on the two portions. The two portions of layer 264 may again be for high side and low side die, which may be embedded in recesses. For example each portion may include a separate MOSFET (HS MOSFET and LS MOSFET) or each portion may include a separate insulated gate bipolar transistor (IGBT) and fast recovery diode (FRD), as non-limiting examples.

In implementations, instead of a single metallic layer of one substrate being split into two portions, separate substrates may be used on one side (top side or bottom side) of the package to accomplish the separation of HS and LS die/components. In such an implementation there may then be at least three substrates—one substrate on a top or bottom side and two substrates on the opposite side to hold the HS/LS die within recesses.

In implementations of forming packages disclosed herein a solder mask/photoresist layer may be used prior to laying down or depositing the first metallic layer which couples the die within a recess. While high melting temperature solders and Ag sintering are disclosed herein for coupling the die within a recess, in other implementations any thermally conductive die attach material may be used, and may need to be reflowed to form the first part or half of the package (the top substrate or lead frame coupled with the die). The bottom half or part is formed by providing or forming the bottom substrate/lead frame structure. The two halves or portions are coupled together as discussed herein, using a soldered or sintered layer, and the die and layers are then encapsulated to form a package.

Some of the implementations of semiconductor packages disclosed herein protect the die from damage in part due to excluding a spacer and also by embedding the die within a recess of a metallic layer or lead frame. All failure modes related to spacers are removed for those packages without spacers. Embedding the die within a recess may also reduce or eliminate solder voids, thus reducing or eliminating damage caused by such voids. Some packages herein have shorter thermal and electrical paths due to excluding a spacer and embedding the die within the recess, enhancing thermal and electrical performance. Material costs are also reduced for packages which exclude spacers and for which there are fewer reflowed or sintered metallic layers. Packages disclosed herein may allow for ultra-thin AHPMs which may make three-phase inverters more compact and capable of increased power density.

Other steps not discussed herein may be used in the formation of the packages, and those steps that are disclosed are simply highlighting some of the steps of the fabrication process. For example: multiple photoresist layers may be laid down and patterned sequentially to patterned simultaneously for patterning purposes, and those layers exposed, with exposed portions removed (or left behind); passivation layers may be formed on metallic layers, with portions of the passivation removed through selective material removal (such as using photoresist and etching or the like); singulation may be done after encapsulation, and so forth.

As used herein, the terms “partially encapsulated,” “fully encapsulated” and their variants have specific meanings. Referring to FIGS. 2-14, each of the die, after the encapsulation step, is considered to be fully encapsulated in the encapsulant, even though there is no encapsulant directly above and/or below each die (but rather one or more solders or sintered metals and/or residual photoresist), because each die is fully surrounded by a combination of encapsulant and elements that are themselves at least partially encapsulated within the encapsulant. Each metallic layer or insulator layer that is exposed through the encapsulant is only partially encapsulated in the encapsulant, because a portion is exposed through the encapsulant. Not all packages shown in the drawings show electrical leads in addition to exposed metallic layers at an outside of the package(s), for ease in viewing the other elements, but all packages shown in the drawings may have leads exposed through the encapsulant or extending from the encapsulant, and such leads would only be partially encapsulated in the encapsulant.

In places where the description above refers to particular implementations of semiconductor packages and related methods and implementing components, sub-components, methods and sub-methods, it should be readily apparent that a number of modifications may be made without departing from the spirit thereof and that these implementations, implementing components, sub-components, methods and sub-methods may be applied to other semiconductor packages and related methods.

What is claimed is:

1. A semiconductor package, comprising:

a first insulator layer coupled with a first metallic layer, the first metallic layer comprising a recess therein;

a semiconductor die mechanically coupled at least partially within the recess, a perimeter of the semiconductor die located entirely within a perimeter of the recess;

a second metallic layer coupled with a second insulator layer, the second metallic layer mechanically coupled with the semiconductor die; and an encapsulant at least partially encapsulating the first insulator layer, the first metallic layer, the semiconductor die, the second insulator layer, and the second metallic layer;

wherein the first insulator layer and the first metallic layer are comprised in a first metal-insulator-metal (MIM) substrate and the second metallic layer is comprised in a second MIM substrate.

2. The semiconductor package of claim 1, wherein the semiconductor die is directly coupled to the first metallic layer within the recess through one of a first soldered metal or a first sintered metal.

3. The semiconductor package of claim 1, wherein a lead frame comprises the first metallic layer.

4. The semiconductor package of claim 1, wherein the second metallic layer comprises two metallic sections electrically isolated from one another prior to coupling the semiconductor die with the second metallic layer.

5. The semiconductor package of claim 1, wherein the second MIM substrate further comprises a third metallic layer opposite the second metallic layer and directly coupled to the second insulator layer, the third metallic layer comprising a slot therein.

6. The semiconductor package of claim 1, further comprising a photoresist layer coupled between the semiconductor die and a plurality of sidewalls of the recess.

7. The semiconductor package of claim 6, wherein the photoresist layer extends to an outermost edge of the first metallic layer.

8. A semiconductor package, comprising:

a first metal-insulator-metal (MIM) substrate comprising a first insulator layer coupled with a first metallic layer, the first metallic layer comprising a recess therein;

a semiconductor die mechanically coupled at least partially within the recess, a perimeter of the semiconductor die located entirely within a perimeter of the recess;

a second MIM substrate comprising a second metallic layer coupled with a second insulator layer, the second metallic layer mechanically coupled with the semiconductor die; and an encapsulant at least partially encapsulating the first insulator layer, the first metallic layer, the semiconductor die, the second insulator layer, and the second metallic layer;

wherein the first MIM substrate and the second MIM substrate are exposed through the encapsulant.

9. The semiconductor package of claim 8, wherein the semiconductor die is directly coupled to the first metallic layer within the recess through one of a first soldered metal or a first sintered metal, and wherein the semiconductor die is directly coupled with the second metallic layer through one of a second soldered metal or a second sintered metal.

10. The semiconductor package of claim 8, wherein a lead frame comprises the first metallic layer.

11. The semiconductor package of claim 8, wherein the second metallic layer comprises two metallic sections electrically isolated from one another prior to coupling the semiconductor die with the second metallic layer.

12. The semiconductor package of claim 8, wherein the second MIM substrate further comprises a third metallic layer opposite the second metallic layer and directly coupled to the second insulative layer, the third metallic layer comprising a slot therein.

13. The semiconductor package of claim 8, further comprising a photoresist layer coupled between the semiconductor die and a plurality of sidewalls of the recess.

14. The semiconductor package of claim 13, wherein the photoresist layer extends to an outermost edge of the first metallic layer.

15. A semiconductor package, comprising:

a first metal-insulator-metal (MIM) substrate comprising a first insulator layer coupled with a first metallic layer, the first metallic layer comprising a recess therein;

a semiconductor die mechanically coupled at least partially within the recess, a perimeter of the semiconductor die located entirely within a perimeter of the recess;

a second MIM substrate comprising a second metallic layer coupled with a second insulator layer, the second metallic layer mechanically coupled with the semiconductor die; and an encapsulant at least partially encapsulating the first insulator layer, the first metallic layer, the semiconductor die, the second insulator layer, and the second metallic layer;

wherein the semiconductor die is directly coupled to the first metallic layer through one of a first soldered metal or a first sintered metal, and wherein the semiconductor die is directly coupled to the second metallic layer through one of a second soldered metal or a second sintered metal.

16. The semiconductor package of claim 15, wherein the semiconductor die is directly coupled to the first metallic layer within the recess through one of a first soldered metal or a first sintered metal, and wherein the semiconductor die is directly coupled with the second metallic layer through one of a second soldered metal or a second sintered metal.

17. The semiconductor package of claim 15, wherein a lead frame comprises the first metallic layer.

18. The semiconductor package of claim 15, wherein the second metallic layer comprises two metallic sections electrically isolated from one another prior to coupling the semiconductor die with the second metallic layer.

19. The semiconductor package of claim 15, wherein the second MIM substrate further comprises a third metallic layer opposite the second metallic layer and directly coupled to the second insulative layer, the third metallic layer comprising a slot therein.

20. The semiconductor package of claim 15, further comprising a photoresist layer coupled between the semiconductor die and a plurality of sidewalls of the recess.

* * * * *